US006982217B2

(12) United States Patent
Imada et al.

(10) Patent No.: US 6,982,217 B2
(45) Date of Patent: Jan. 3, 2006

(54) NANO-STRUCTURE AND METHOD OF MANUFACTURING NANO-STRUCTURE

(75) Inventors: Aya Imada, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 10/391,632

(22) Filed: Mar. 20, 2003

(65) Prior Publication Data
US 2003/0186514 A1 Oct. 2, 2003

(30) Foreign Application Priority Data
Mar. 27, 2002 (JP) .............................. 2002-088206
Apr. 30, 2002 (JP) .............................. 2002-128465

(51) Int. Cl.
H01L 21/20 (2006.01)
H01L 21/302 (2006.01)
H01L 21/461 (2006.01)

(52) U.S. Cl. ...................... 438/584; 438/688; 438/745; 438/760; 257/9; 977/DIG. 1

(58) Field of Classification Search ................ 438/758, 438/760, 584, 688, 745; 257/9–11; 360/324; 977/DIG. 1
See application file for complete search history.

(56) References Cited

U.S. PATENT DOCUMENTS

| 6,130,118 | A  | * | 10/2000 | Yamazaki ................... 438/151 |
| 6,228,751 | B1 | * | 5/2001  | Yamazaki et al. .......... 438/585 |
| 6,475,924 | B2 | * | 11/2002 | Yamamoto et al. ......... 438/758 |
| 6,476,409 | B2 |   | 11/2002 | Iwasaki et al. ............... 257/13 |
| 6,482,752 | B1 | * | 11/2002 | Yamazaki et al. .......... 438/758 |
| 6,713,364 | B2 | * | 3/2004  | Kirchhoff .................... 438/409 |
| 6,717,777 | B2 | * | 4/2004  | Den et al. .................... 360/324 |
| 6,737,668 | B2 | * | 5/2004  | Den et al. ...................... 257/9 |
| 6,790,787 | B2 | * | 9/2004  | Iwasaki et al. .............. 438/758 |

FOREIGN PATENT DOCUMENTS

| JP | 6-32675     | 2/1994  |
| JP | 11-268483   | 10/1999 |
| JP | 2000-195036 | 7/2000  |
| JP | 2000-266773 | 9/2000  |

OTHER PUBLICATIONS

Jessensky et al., "Self-organized Formation of Hexgonal Pore Arrays In Anodic & Aluminum," Appl. Phys. Lett., vol. 72, No. 10., pp. 1173-1175.

H. Masuda et al., "Preparation of Porous Material by Replacing Microstructure of Auodic Aluminum Film With Metal" Chemistry Letters, pp. 621-622 (1990).

S. Shingubara et al., "Ordered Two-Dimensional Nanowire Array Formation Using Self-Organized Nano holes of Anodically Oxidized Aluminum," Jpn. J. Appl. Phys., vol. 36, part I No. 12B.

H. Asoh et al. "Fabrication of ideally ordered anodic porous alumina with 63 nm hole periodicity using sulfuric acid," J. Vac., Sci Technol. B 19(2) pp. 569-572 (2001).

* cited by examiner

Primary Examiner—Alexander Ghyka
(74) Attorney, Agent, or Firm—Fitzpatrick, Cella, Harper & Scinto

(57) ABSTRACT

A structure having projections is provided. The structure having projections comprises a first projection formed on a first layer containing a first material, and a plurality of second projections formed around the first projection and containing a material capable of being subjected to anodic oxidation.

16 Claims, 6 Drawing Sheets

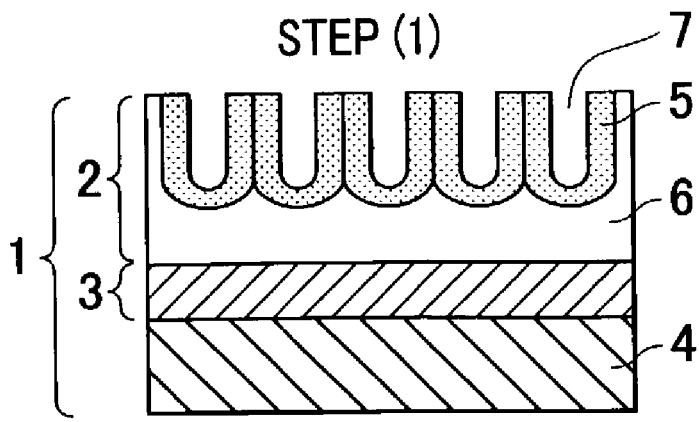
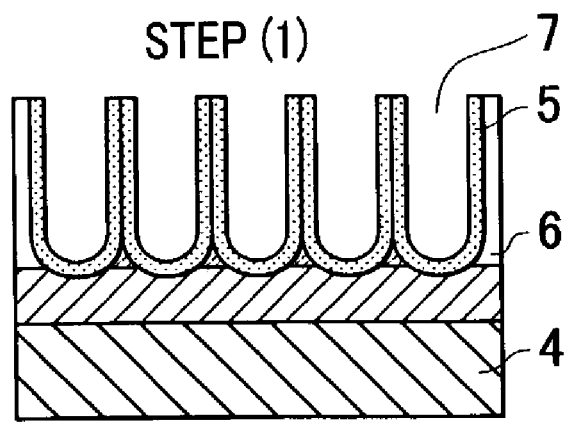
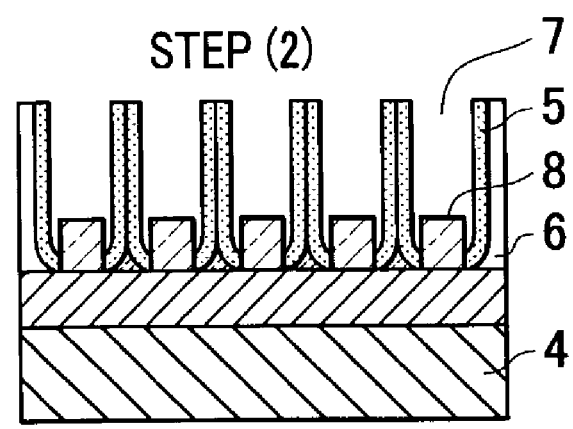
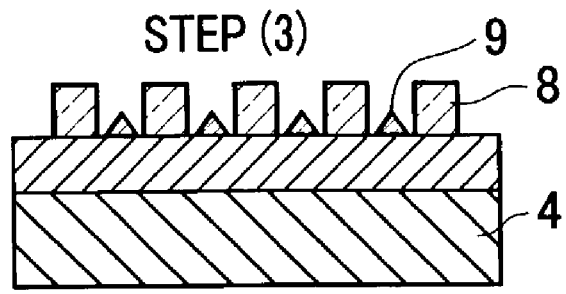

US 6,982,217 B2

NANO-STRUCTURE AND METHOD OF MANUFACTURING NANO-STRUCTURE

BACKGROUND OF THE INVENTION

1. Field of the Invention

The present invention relates to a method of manufacturing a nano-size pitted structure having recesses and projections at a nano-scale pitch. More particularly, the present invention relates to a nano-structure and a method of manufacturing the nano-structure, which can be utilized as a recording medium, an optical functional device, etc.

2. Description of the Related Art

Hitherto, manufacturing a porous structure with the anodic oxidation process has received attention as a simple method for forming a structure having recesses and projections of from nanometer to micrometer sizes. The anodic oxidation process generally comprises the steps of immersing a workpiece in an acidic solution, and applying a voltage with the workpiece serving as an anode to cause phenomena of dissolution and oxidation of the workpiece surface at the same time, thereby forming a microscopic pitted structure. This microscopic structure is known as exhibiting regularity through self-assembly under certain conditions (such as voltage, temperature and kind of acid), and applications of the microscopic structure to various nano-devices, such as a recording medium and an optical functional device, are expected.

One practical example of the anodic oxidation process is anodic oxidation of Al. When a voltage is applied to a bath of an aqueous solution of oxalic acid, phosphoric acid, or sulfuric acid with Al serving as an anode, nanoholes surrounded by a barrier layer (alumina) are formed and a porous coating is obtained. While a similar phenomenon may also occur with another kind of metal, columnar pores (nanoholes) with the best straightness can be obtained using Al. The anodic oxidation of Al can form pores in a regular array in which the pore pitch is several tens nanometers (Appl. Phys. Lett., 72, 1173, 1998), or in an irregular array in which the average pore pitch is about 18 nm and the pore diameter is 8 nm (Japanese Patent Laid-Open No. 2000-195036).

Also, a pillar nano-structure has been fabricated by using, as a mold, a hole nano-structure formed by the anodic oxidation process (FIGS. 6A to 6D). In Japanese Patent Laid-Open No. 6-32675, Chemistry Letters, 621, 1990, and Jpn. J. Appl., 36, 7791, 1997, for example, a pillar structure is formed by using an alumina hole nano-structure 102 caused by the anodic oxidation of Al 101 as a mold, filling a material 104, such as a resin or a metal, in each of pores 103, and removing the alumina 102 mold. Further, it is proposed to perform a hole nano-structure 105 through stamping or filling with the pillar structure used as a die or a mold (J. Vac. Sci. Technol. B., 19(2), 569, 2001). Those proposals can produce a nanometer-size structure having a high aspect ratio, which cannot be obtained by manufacturing methods utilizing semiconductor processes. Here, the term "aspect ratio" represents y/x where x is the pore diameter and y is the pore depth.

SUMMARY OF THE INVENTION

In manufacturing of the pillar structure, several methods are conceivable to fill a material, such as a resin or a metal, in each of pores. For example, when filling a liquid resin, the liquid may be dripped to hole openings under a vacuum, or the de-bubbling process may be performed based on centrifugal forces. Also, sputtering or vapor deposition is primarily employed to fill a metal or the like, but it is difficult to achieve the uniform height of the pillar structure because of the necessity of close condition setting.

Further, after filling the material, it is required to remove the hole nano-structure used as a mold, and to provide a base for supporting the filled material when the pillar structure is employed as a stamper, etc. In order to keep uniform heights of stamper bosses, however, the support base for the filled material must be held closely parallel to a substrate when the support base is fixed to the substrate using, e.g., an adhesive.

There is also a demand for the anodic oxidation process to be capable of forming a microscopic structure having a smaller pore pitch in a shorter time. However, a limitation exists at several tens nanometers in forming start points for pore formation by electron beam drawing, etc., and a long time is required for such a process.

As described above, the conventional methods are not satisfactory in workability, required time, and economic efficiency, and development of a simpler method improved in those points is demanded. In view of that state of the art, it is an object of the present invention to provide a nano-structure and a method of manufacturing the nano-structure, which has overcome the problems set forth above and having a pitted structure more easily controllable.

To achieve the above object, with the method of manufacturing a nano-structure according to the present invention, a projected nano-structure is manufactured by forming inclusions in pores from the bottoms of the pores, which have been formed in a layer of a workpiece by anodic oxidation, with electroplating or with oxidation of an undercoat layer, and then removing the layer having been subjected to the anodic oxidation.

A structure having projections, according to the present invention, comprises a first projection formed on a first layer containing a first material; and a plurality of second projections formed around the first projection and containing a material capable of being subjected to anodic oxidation.

The material capable of being subjected to anodic oxidation is, e.g., aluminum or silicon.

Also, a method of manufacturing a structure having projections, according to the present invention, comprises the steps of preparing a member having a second layer formed on a first layer; forming pores in the second layer; forming first projections in the pores; and removing the second layer.

The step of forming pores is carried out by etching or anodic oxidation of the workpiece.

More specifically, a first method according to the present invention comprises a step (1) of carrying out anodic oxidation of a workpiece, which is made up of a substrate, an undercoat layer and a layer subjected to the anodic oxidation and containing Al as a main component, to form pores in the layer, a step (2) of oxidizing the exposed undercoat layer in a solution or a gas containing oxygen as a main component to form oxide projections projected in the pores, and a step (3) of removing the layer having been subjected to the anodic oxidation (see FIGS. 1A to 1D).

In the step (2), when the undercoat layer 3 is oxidized in a solution not eroding alumina or in a gas containing oxygen as a main component, the oxide projections 8 are gradually filled from the bottoms of the pores to the interiors because the oxide projections 8 have increased volumes. The solution used in the step (2) is preferably, e.g., an aqueous solution of ammonium borate, ammonium tartrate, or ammonium citrate. By finally dissolving and removing the layer 2, which has been subjected to the anodic oxidation, using, e.g., an aqueous solution containing phosphoric acid, a projected nano-structure having the oxide projections is obtained.

A second method according to the present invention comprises a step (1) of carrying out anodic oxidation of a workpiece, which is made up of a substrate, an undercoat layer and a layer subjected to the anodic oxidation and containing Al as a main component, to form pores in the layer, a step (4) of forming projections of an electrically conductive material within the pores from the pore bottoms by electroplating, and a step (3) of removing the layer having been subjected to the anodic oxidation (see FIGS. 2A to 2D).

While the step (1) is similar to that in the first method according to the present invention, the workpiece may be an aluminum plate having no undercoat layer, or it may be obtained by forming an electrically conductive undercoat layer of a tungsten film, for example, on an insulating substrate and then forming an aluminum film thereon.

A third method according to the present invention comprises a step of forming, on the nano-structure obtained by the above-described first or second method of the present invention, a material different from that of the nano-structure by, e.g., sputtering or vapor deposition (see FIG. 3). In general, though depending on the layer forming conditions, an overlaid material has a projected surface reflecting the surface shape of the underlying projected structure. When employing the projected nano-structure as a stamper, the nano-structure is required to have a certain level of strength, and if a sufficient strength is not obtained with the original projected nano-structure, a hard material such as tungsten (W) is may be coated thereon for reinforcement. Also, the function of a photonic crystal having three-dimensional periodicity can be realized by repeatedly coating materials having different dielectric constants.

A fourth method according to the present invention corresponds to a special case of the third method. As shown in FIG. 5A, the height of the projected structure having the oxide projections or the conductive material projections formed by the first or second method of the present invention, respectively, is set almost equal to the height of remaining projections of the layer subjected to the anodic oxidation, which have been formed as a result of the step (3), (the difference in height between both the projections is preferably not more than 200 nm). A dented structure is formed by using the above projected structure as a stamper according to the third method, and is newly employed as a structure for starting a next step of anodic oxidation. By forming pore start points in a regular array with an electron beam (EB), for example, before starting the anodic oxidation in the step (1) of the first or second method and then carrying out the anodic oxidation at an applied voltage corresponding to the array pitch, regularly arrayed pores are formed, as a result of which a structure having likewise regularly arrayed projections can be obtained. As shown in FIG. 4, the remaining projections left after removing the layer having been subjected to the anodic oxidation are in the form of triangular pyramids positioned in a hexagonal pattern with each projection of the projected structure located at the centroid. By forming the dented structure using the above-mentioned projected structure as a stamper (FIG. 5B) and carrying out the anodic oxidation again at an appropriate applied voltage with the dented structure used as a start structure, pores can be formed at a pitch of $A/3^{1/2}$ smaller than a pitch A of the pores that have been formed by the anodic oxidation carried out to obtain the stamper. Thus, a finer nano-structure can be manufactured in a short time by repeating the above-mentioned process.

The nano-structure of the present invention includes a hole nano-structure having a surface in which a large number of recesses are arranged, and a pillar nano-structure having a surface in which a large number of projections are arranged. Those nano-structures can be employed as bases for forming optical functional devices and recording media which utilize a microscopic structure on the nano-order. In the nano-structure of the present invention, preferably, the diameters of the projections or recesses forming a pitted surface of the nano-structure have a maximum value not beyond 1000 nm. A typical form of the recesses is a hole defining a columnar hollow that is substantially circular in section, and a typical form of the projections is a pillar that is substantially circular in section.

Among the nano-structures of the present invention, the pillar nano-structure can be obtained, for example, by forming, on an undercoat layer made of a material developing volume expansion with oxidation, a layer which is to be subjected to anodic oxidation and is capable of forming fine pores therein by the anodic oxidation, carrying out the anodic oxidation on the layer to be subjected to anodic oxidation to form therein a large number of pores extending in a direction of thickness of the layer, and oxidizing an exposed portion of the undercoat layer in a state in which the undercoat layer is partly exposed at the bottom of each pore, thereby expanding the exposed undercoat layer to form projections of oxides of the material constituting the undercoat layer.

Further, the present invention provides a method of manufacturing a projected nano-structure, the method comprising the step of filling a material from the bottom of a recessed nano-structure formed by anodic oxidation. By utilizing the projected nano-structure thus manufactured, a more finely recessed nano-structure can be manufactured with ease.

In addition, by employing the manufacturing method of the present invention, it is possible to obtain a nano-structure having pillar-shaped projections, which are arranged in finer and more regular array and can be formed in an easier manner than conventional methods.

Further objects, features and advantages of the present invention will become apparent from the following description of the preferred embodiments with reference to the attached drawings.

BRIEF DESCRIPTION OF THE DRAWINGS

FIGS. 1A to 1D are sectional views for explaining a first method according to the present invention, in which FIG. 1A shows a step of carrying out anodic oxidation of a workpiece to form pores in a layer subjected to the anodic oxidation, FIG. 1B shows a step of enlarging the pores through treatment in an acidic solution, FIG. 1C shows a step of oxidizing an exposed undercoat layer to form oxides in the pores, and FIG. 1D shows a step of removing the layer having been subjected to the anodic oxidation.

FIGS. 5A to 5D show a method of manufacturing a pillar structure according to the present invention, in which FIG. 5A is a sectional view showing a stamper subjected to sputtering after anodic oxidation, FIG. 5B is a schematic view showing a state in which stamping is carried out using the stamper, FIG. 5C is a sectional view showing a dented structure of an Al plate after the stamping, and FIG. 5D is a sectional view showing a dented structure obtained after anodic oxidation carried out with the dented structure after the stamping serving as a start structure.

FIGS. 6A to 6D show a conventional method of manufacturing a pillar structure according to the present invention, in which FIG. 6A is a sectional view showing an alumina hole nano-structure, FIG. 6B is a sectional view showing a state in which a material, such as a resin or a metal, is filled in each of pores, FIG. 6C is a sectional view showing a pillar structure after removing an alumina hole nano-structure, and FIG. 6D is a sectional view showing a state in which a hole nano-structure is performed by stamping or filling with the pillar structure used as a die or a mold.

DESCRIPTION OF THE PREFERRED EMBODIMENTS

Figure 2A:
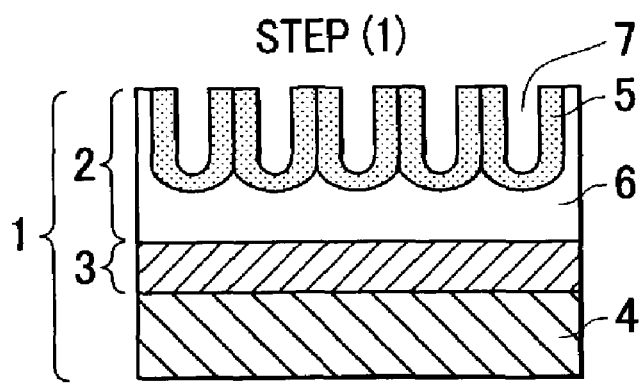
FIGS. 2A to 2D are sectional views for explaining a second method according to the present invention.
Figure 2B:
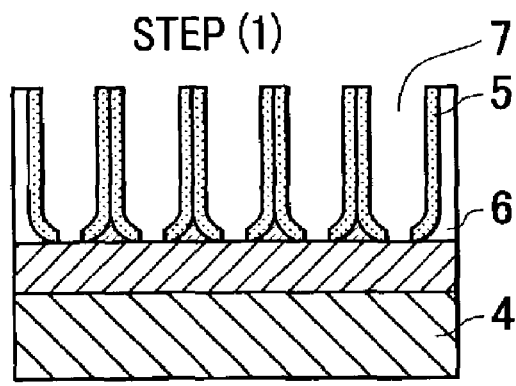
Figure 2C:
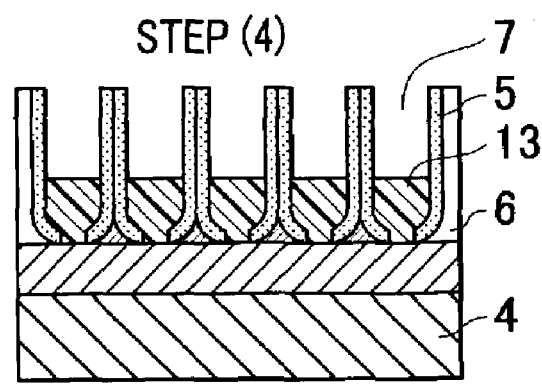
Figure 2D:
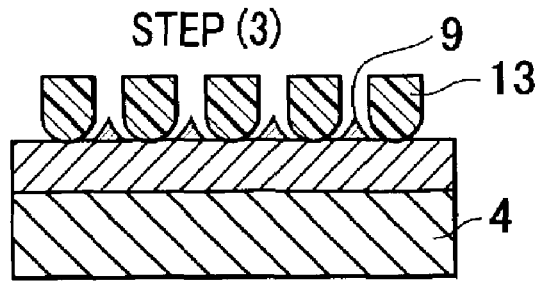

One embodiment of a first method for obtaining a nano-structure according to the present invention is a method of manufacturing a pillar nano-structure having a projected structure, and comprises the steps of carrying out anodic oxidation of a workpiece 1, which is made up of an undercoat layer 3 and a layer 2 subjected to the anodic oxidation, to form pores 7 in the layer 2 (FIG. 1A), oxidizing the exposed undercoat layer 3 to form oxides 8 projected in the pores 7 (FIG. 1C), and removing the layer 2 having been subjected to the anodic oxidation (FIG. 1D). If necessary, the pores formed by the anodic oxidation can be further enlarged through treatment in an acidic solution (FIG. 1B).

With a method of manufacturing a nano-structure according to the present invention, a projected nano-structure is manufactured by forming inclusions in pores from the bottoms of the pores, which have been formed in a layer of a workpiece by anodic oxidation, with electroplating or with oxidation of an undercoat layer, and then removing the layer having been subjected to the anodic oxidation.

Stated otherwise, a first method according to the present invention comprises a step (1) of carrying out anodic oxidation of a workpiece 1, which is made up of a substrate 4, an undercoat layer 3 and a layer 2 subjected to the anodic oxidation and containing Al as a main component, to form pores 7 in the layer 2, a step (2) of oxidizing the exposed undercoat layer 3 in a solution or a gas containing oxygen as a main component to form oxide projections 8 projected in the pores 7, and a step (3) of removing the layer 2 having been subjected to the anodic oxidation (see FIGS. 1A to 1D).

On the substrate 4 made of Si, for example, the undercoat layer 3 containing at least one of elements selected from among W, Nb, Mo, Ta, Ti, Zr and Hf is formed by, e.g., sputtering or vapor deposition. The layer 2 subjected to the anodic oxidation and containing Al as a main component is formed thereon. The layer 2 subjected to the anodic oxidation may additionally contain any other components in amount not impeding formation of nanoholes by the anodic oxidation. Then, an appropriate voltage is applied to a bath of a treatment solution, while the Al layer is used as an anode, thereby forming the pores 7 to such an extent that the undercoat 3 is exposed (step (1))(FIG. 1A). The treatment solution is preferably an aqueous solution of oxalic acid, phosphoric acid or sulfuric acid, or a mixture of these acids. Any other suitable acid is also usable. The appropriate applied voltage is decided depending on the desired pore pitch. It is known that the relationship of the applied voltage (V)=the pore pitch (nm)/2.5 approximately holds. The bath temperature is not limited to a particular value so long as the treatment solution neither solidifies nor boils, and the layer 2 subjected to the anodic oxidation is efficiently dissolved. Next, in the step (2), the undercoat layer 3 is oxidized in a solution not eroding alumina. Because the resulting oxides 8 have increased volumes, the oxides 8 are expanded from the bottoms of the pores to the interiors, whereupon projections are formed (FIG. 1C). The solution used in the step (2) is preferably, e.g., an aqueous solution of ammonium borate, ammonium tartrate, or ammonium citrate. Finally, the layer 2 having been subjected to the anodic oxidation is dissolved and removed using, e.g., an aqueous solution containing phosphoric acid, whereby a pillar nano-structure having projections formed by the undercoat layer oxides 8 is obtained (FIG. 1D).

A second method according to the present invention comprises a step (1) of carrying out anodic oxidation of a workpiece 1, which is made up of a substrate 4, an undercoat layer 3 and a layer 2 subjected to the anodic oxidation and containing Al as a main component, to form pores 7 in the layer 2, a step (4) of forming projections 13 of an electrically conductive material within the pores 7 from the pore bottoms by electroplating, and a step (3) of removing the layer 2 having been subjected to the anodic oxidation (see FIGS. 2A to 2D).

While the step (1) is similar to that in the first method according to the present invention, the workpiece may be an aluminum plate having no undercoat layer, or it may be obtained by forming an electrically conductive undercoat layer 3 of a tungsten film, for example, on an insulating substrate 4 and then forming an aluminum film thereon.

In the next step (4), the workpiece is immersed in an electroplating bath, and electroplating is carried out with the bottoms of the pores 7 serving as an electrode. Various elements, such as Cu, Ag and Co, are usable as plating materials. The type of plating bath is preferably one not eroding alumina of the layer 2 having been subjected to the anodic oxidation. Finally, the layer 2 having been subjected to the anodic oxidation is dissolved and removed using, e.g., a mixture of an aqueous solution of phosphoric acid and an aqueous solution of chromic acid. As a result, a nano-structure having projections formed by the plating material is obtained.

Figure 3:
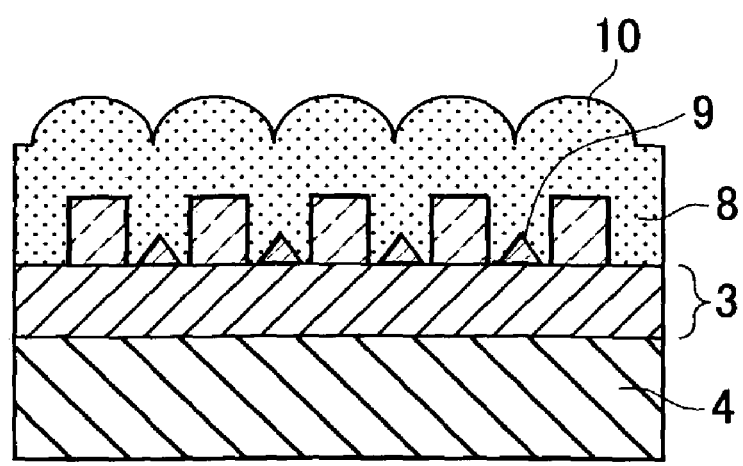
FIG. 3 is a sectional view showing a nano-structure obtaining by overlaying a different material on a basic nano-structure.

A third method according to the present invention comprises a step of forming, on the nano-structure obtained by the above-described first or second method of the present invention, a material different from that of the nano-structure by, e.g., sputtering or vapor deposition (FIG. 3). In general, though depending on the layer forming conditions, an overlaid material 10 has a projected surface reflecting the surface shape of the underlying projected structure.

When employing the projected nano-structure as a stamper, the nano-structure is required to have a certain level of strength, and if a sufficient strength is not obtained with the original projected nano-structure, a hard material such as tungsten is preferably coated thereon. Also, the function of a photonic crystal having three-dimensional periodicity can be realized by repeatedly coating materials having different dielectric constants by a method of oblique incidence film formation, for example, while maintaining the projected nano-structure.

Figure 4:
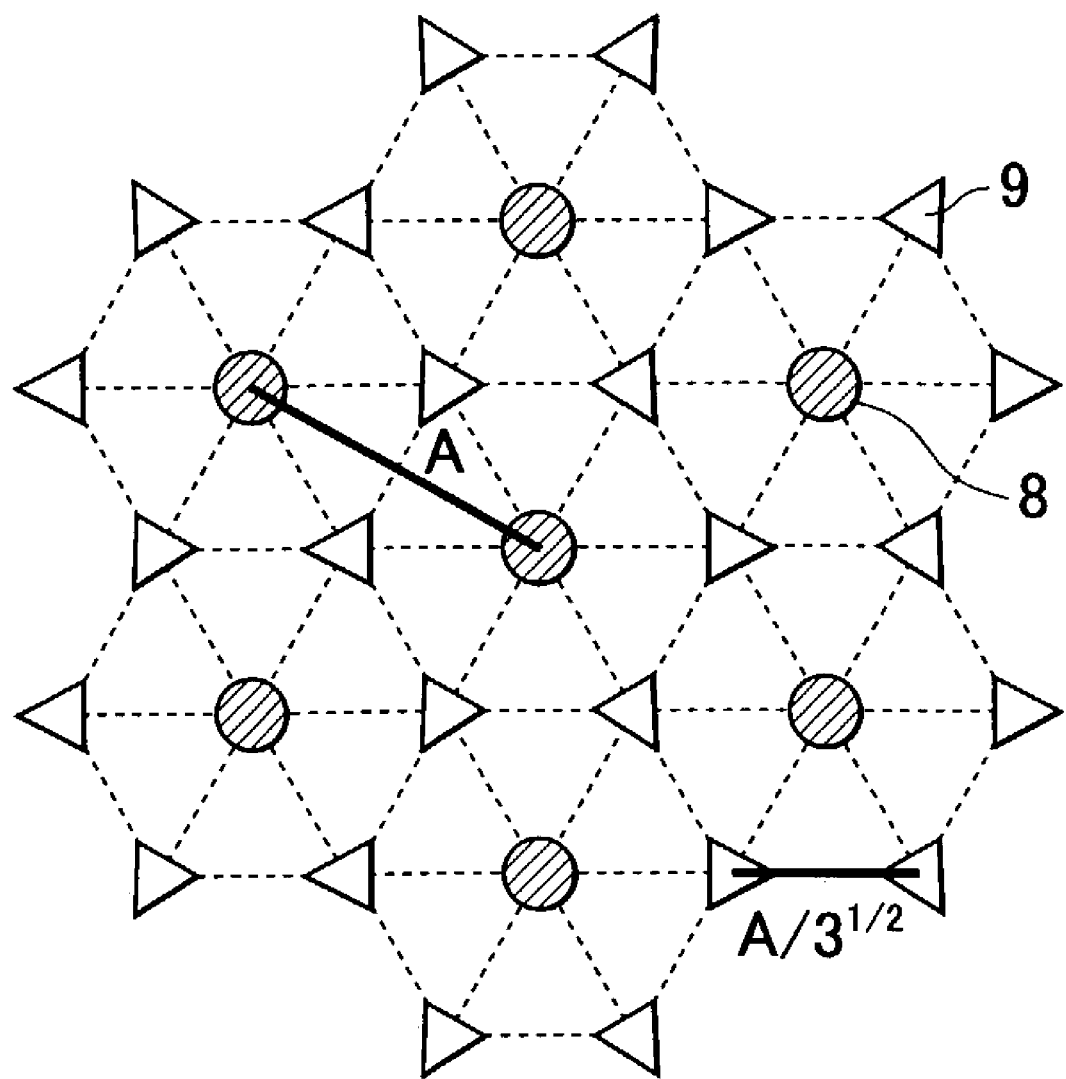
FIG. 4 is a plan view showing a nano-structure used as a stamper.
Figure 5A:
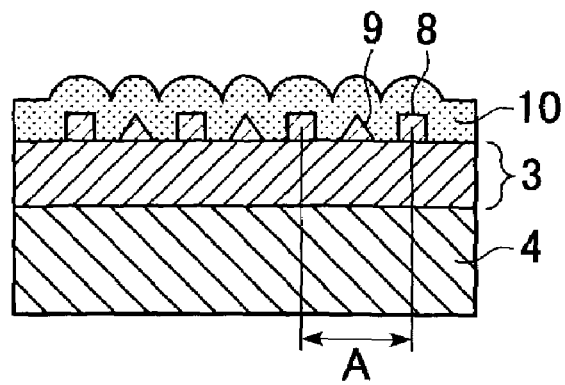
Figure 5B:
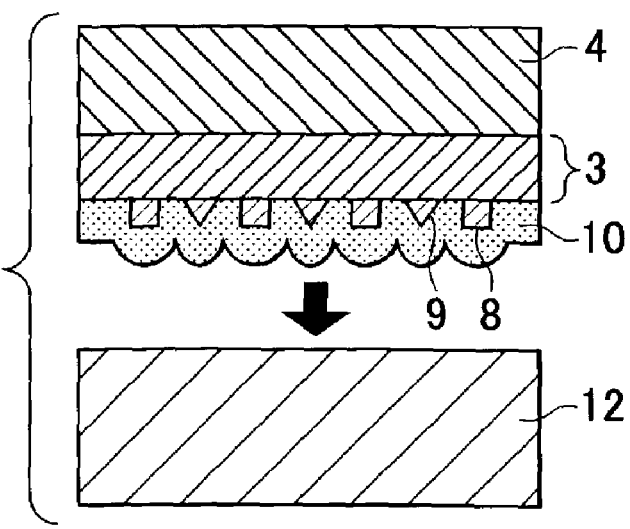

A fourth method according to the present invention corresponds to a special case of the third method. As shown in FIG. 5A, the height of the projected structure having the oxide projections 8 or the conductive material projections 13 formed by the first or second method of the present invention, respectively, is set almost equal to the height of remaining projections 9 of the layer 2 subjected to the anodic oxidation, which have been formed as a result of the step (3), (the difference in height between both the projections is preferably not more than 200 nm). A dented structure 11 is formed by using the above projected structure as a stamper according to the third method, and is newly employed as a structure for starting a next step of anodic oxidation. On that occasion, the difference in height between the oxide projections (projected structure) 8 of the stamper and the remaining projections 9 left after removing the layer 2 having been subjected to the anodic oxidation is preferably not more than 200 nm. Which ones of the oxide projections 8 and the remaining projections 9 left after removing the layer 2 having been subjected to the anodic oxidation have a larger height is a matter of choice depending on cases. By forming pore start points in a regular array with an electron beam (EB), for example, before starting the anodic oxidation in the step (1) of the first or second method and then carrying out the anodic oxidation at an applied voltage corresponding to the array pitch, regularly arrayed pores are formed, as a result of which a structure having likewise regularly arrayed projections can be obtained. As shown in FIG. 4, the remaining projections 9 left after removing the layer 2 having been subjected to the anodic oxidation are in the form of triangular pyramids positioned in a hexagonal pattern with each projection of the projected structure located at the centroid. By forming the dented structure 11 using the above-mentioned projected structure as a stamper (FIG. 5B) and carrying out the anodic oxidation again at an appropriate applied voltage with the dented structure 11 used as a start structure, pores 7 can be formed at a pitch of $A/3^{1/2}$ smaller than a pitch A of the pores that have been formed by the anodic oxidation carried out to obtain the stamper. In other words, a finer nano-structure can be manufactured in a short time by repeating the above-mentioned process.

In order to manufacture a pitted alumina structure having recesses and projections at a pitch of about 100 nm, the anodic oxidation is preferably carried out, for example, by applying 40 V to a bath of an aqueous solution of 0.3-mol/l oxalic acid at 16° C. with the layer subjected to the anodic oxidation serving as an anode. The pitted structure thus formed can be observed using an electronic microscope, for example, and regularity of the pitted structure can be evaluated using an X-ray diffraction apparatus, for example.

Also, even for a material in which nanoholes cannot be formed by the anodic oxidation, a nano-structure having an irregular pore array finer than the pore pitch in the stamper can be manufactured using the projected nano-structure as the stamper. Further, even for a material in which nanoholes can be formed by the anodic oxidation, by carrying out the anodic oxidation under conditions at which the self-assembly does not occur, a nano-structure having an irregular pore array can be manufactured. The conditions at which the self-assembly does not occur can be set to, e.g., 40 V and 16° C. when a solution of phosphoric acid is employed as the treatment solution. The nano-structure having an irregular pore array can be utilized, similarly to the nano-structure having a regular pore array, as a recording medium and an optical functional device by filling a magnetic substance in the nano-structure.

Thus, the nano-structure manufactured by the present invention can be used as, for example, a magnetic recording medium by filling a ferromagnetic substance in each of the pores. Because such a magnetic recording medium has a finer and more uniform structure in nano-scale than conventional recording media, it is possible to realize a higher recording density and to provide a smaller recording apparatus and medium, etc. than conventional ones.

EXAMPLES

Example 1

Manufacturing of Nano-Structure

One example of the first method according to the present invention will be described below.

One example of the first method according to the present invention comprised, as shown in FIGS. 1A to 1D, a step (1) of carrying out anodic oxidation of a workpiece 1, which is made up of an undercoat layer 3 and a layer 2 subjected to the anodic oxidation and containing Al as a main component, to form pores 7 in the layer 2, a step (2) of oxidizing the exposed undercoat layer 3 in a solution to form oxide projections 8 projected in the pores 7, and a step (3) of removing the layer 2 having been subjected to the anodic oxidation.

The step of oxidizing the exposed undercoat layer 3 to form the oxide projections 8 may be performed by heat-treating the exposed undercoat layer in an atmosphere containing oxygen, or by etching away an exposed surface layer and then heat-treating the undercoat layer in an atmosphere containing oxygen.

The workpiece 1 was prepared by forming, on a substrate 4 made of Si, an Nb film as the undercoat layer 3 in thickness of about 100 nm by sputtering, and then forming an Al film thereon as the layer 2 subjected to anodic oxidation in thickness of about 1000 nm. As the step (1), the anodic oxidation was carried at an applied voltage of 40 V while the workpiece 1 was immersed in an aqueous solution of oxalic acid at 16° C. to serve as an anode. As a result, an aluminum oxide (alumina) film was formed in a pore wall with the progress of dissolution and oxidation, whereby the pores 7 were formed in an array at a pitch of about 100 nm (FIG. 1A). The above conditions represent self-assembly conditions for the anodic oxidation, and regularly arrayed pores can be obtained by carrying out the anodic oxidation for a long time.

The anodic oxidation was brought to an end at the time when the pores 7 reached the Nb undercoat layer 3. After washing with water, the workpiece 1 was immersed in an aqueous solution of phosphoric acid for about 40 minutes to dissolve the alumina film, thereby enlarging the pore diameter (FIG. 1B). Then, as the step (2), the workpiece 1 was immersed in an aqueous solution of ammonium borate and subjected to oxidation with the workpiece 1 serving as an anode. As a result, oxides having expanded volumes were formed within the pores, and the Nb oxides 8 were formed at a height proportional to the applied voltage (FIG. 1C). For example, the height of the Nb oxides 8 was about 60 nm when the applied voltage was 50 V, about 120 nm when the applied voltage was 70 V, and about 180 nm when the applied voltage was 100 V. Finally, as the step (3), the workpiece 1 was immersed in a mixture of an aqueous solution of phosphoric acid and an aqueous solution of chromic acid to remove the alumina portion. Consequently, as shown in FIG. 4, when the pores were in a regular array, Al projections (projected structure) 9 left between the pores remained between the Nb oxides 8, and when the pores were in a irregular array, the Al projections 9 remained in a slightly disordered array.

Example 2

One example of the second method according to the present invention will be described below.

One example of the second method according to the present invention comprised, as shown in FIGS. 2A to 2D, a step (1) of carrying out anodic oxidation of a workpiece 1, which is made up of an undercoat layer 3 and a layer 2 subjected to the anodic oxidation and containing Al as a main component, to form pores 7 in the layer 2, a step (4) of forming projections 13 of an electrically conductive material within the pores 7 from the pore bottoms by electroplating, and a step (3) of removing the layer 2 having been subjected to the anodic oxidation.

While the step (1) was similar to that in above Example 1, the undercoat layer 3 was in the form of a tungsten film. In this Example 2, since the electrically conductive projections were formed between the pores 7 and the tungsten undercoat layer 3, electrical conduction was established from the interiors of the pores to the undercoat layer. Then, as the step (4), the workpiece was immersed in a nickel electroplating bath, and electroplating was carried out with the bottoms of the pores 7 serving as a cathode. On that occasion, because many plating baths are generally acidic or weakly acidic, it is preferable to select a bath not eroding alumina films 5 defining the pores 7. Finally, the step (3) was carried out in a similar way to that in Example 1. As a result, remaining aluminum projections 9 left between the pores were obtained as shown in FIG. 4. When the pores were in an irregular array, the remaining aluminum projections 9 were also irregularly arranged reflecting the irregular pore array.

Example 3

Manufacturing of Nano-Structure Having Protective Layer on Pitted Surface of Nano-Structure One example of the third method according to the present invention will be described below.

With one example of the third method according to the present invention comprised, as shown in FIG. 3, a step of forming, on a nano-structure obtained by the above-described Example 1 or 2, a material different from that of the nano-structure by, e.g., sputtering or vapor deposition. In general, though depending on the layer forming conditions, an overlaid material 10 has a projected surface reflecting the surface shape of the underlying projected structure.

When employing the projected nano-structure as a stamper, for example, a sufficient strength is not obtained with the projections of Nb oxides or Ni oxides in some cases. In these cases, by coating a hard material such as tungsten by sputtering, a projected nano-structure is formed which has a surface reflecting the surface shape of the original nano-structure as shown in FIG. 3.

By forming a tungsten film in thickness of 150 nm by sputtering on the nano-structure manufactured in Example 1, in which the Nb oxide projections had a height of about 120 nm on conditions of the pore pitch being 100 nm and the applied voltage being 70 V, a column-shaped projected structure having a column height of 280 nm and a level difference of 35 nm was obtained and the curvatures of resulting recesses between a column and another column were kept small. When a load of 196 MPa (2000 kgf/cm$^2$) was applied to the nano-structure before sputtering tungsten, the Nb oxide projections were collapsed to be flat. However, when the same load was applied after sputtering tungsten, no changes in shapes of the Nb oxide projections were found.

Example 4

Manufacturing of Nano-Structure Using Stamper

One example of the fourth method according to the present invention will be described below. In this Example, as shown in FIG. 5A, the height of the projected structure having the oxide projections 8 or the conductive material projections 13 formed by the first or second method of the present invention, respectively, was set almost equal to the height of the remaining projections 9 of the layer 2 subjected to the anodic oxidation, which have been formed as a result of the step (3). A dented structure 11 was formed by using the above projected structure as a stamper according to the third method, and was newly employed as a structure for starting a next step of anodic oxidation.

Figure 5C:
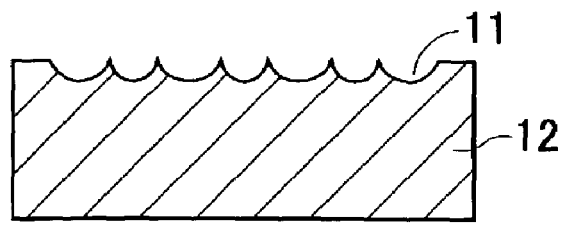
Figure 5D:
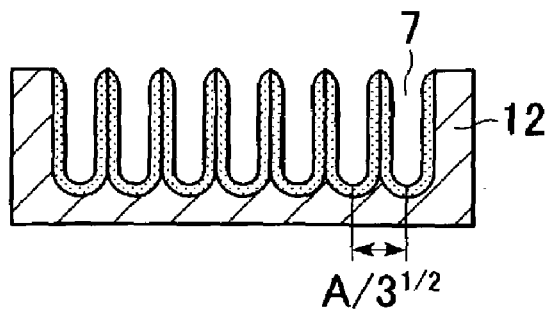
Figure 6A:
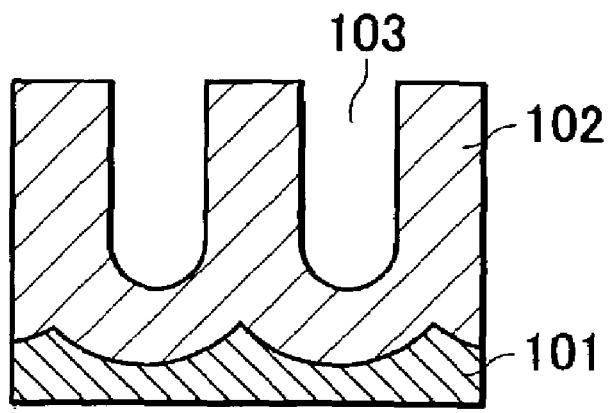
Figure 6B:
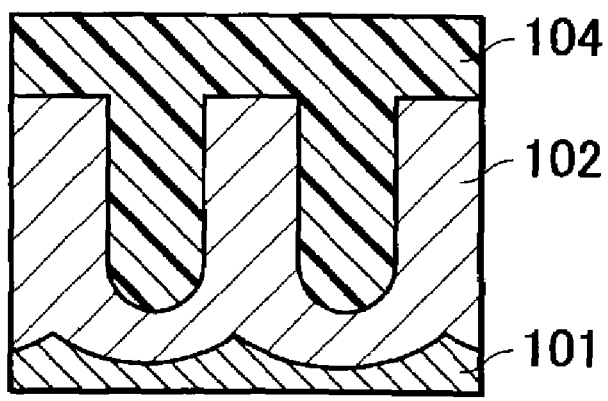
Figure 6C:
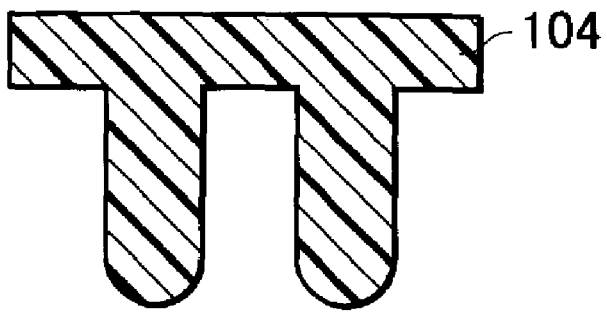
Figure 6D:
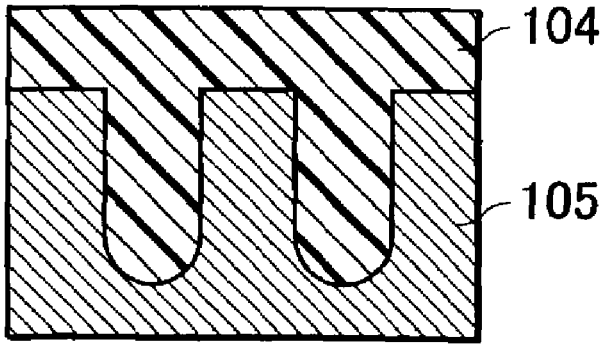

As in Example 1, the workpiece 1 was prepared by forming, on a substrate 4 made of Si, an Nb film as the undercoat layer 3 in thickness of about 100 nm by sputtering, and then forming an Al film thereon as the layer 2 subjected to anodic oxidation in thickness of about 1000 nm. After forming, on an Al surface, a dent array (FIG. 4) in a regular triangular grid pattern with a period of 100 nm by electron beam drawing, the anodic oxidation was carried under the same conditions as those in the step (1) of Example 1, and then immersed in a mixture of an aqueous solution of phosphoric acid and an aqueous solution of chromic acid, thereby enlarging the pore diameter (FIG. 1B). Because the mixed solution preferentially dissolved alumina over Al, Al portions present between the pores remained as projections 9 with heights of several nanometers to ten and odds nanometers (FIG. 4). Then, Nb oxides 8 were formed in a similar way to that in Example 1. At this time, the applied voltage was adjusted such that, as shown in FIG. 5A, the Nb oxides 8 had a height equal to the height of the remaining projections 9. Subsequently, a tungsten film of about 100 nm was formed on the projections by sputtering to provide strength required for a stamper as in Example 3, whereby a stamper having a sectional structure shown in FIG. 5A was obtained. In this Example, a pitch A of the Nb oxide projections 8 was 100 nm. Then, the thus-obtained stamper was stamped against an Al plate 12 under pressure of 294 MPa (3000 kgf/cm$^2$) (FIG. 5B), whereby a dented structure 11 was formed in an Al plate surface in a triangular grid pattern with a period of $A/3^{1/2}=58$ nm (FIG. 5C). By carrying out anodic oxidation of the Al plate at an applied voltage of 23 V in an aqueous solution of oxalic acid at 10° C. or an aqueous solution of phospheric acid at 10° C., finer pores were formed, as shown in FIG. 5D, at a period $A/3^{1/2}$ smaller than the period A of the pores that have been formed by the anodic oxidation carried out to obtain the stamper. In other words, a periodic structure having a pore pitch, which was not obtainable with the electron beam drawing, etc., could be manufactured in this Example according to the above-described process.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A structure having a plurality of projections, comprising:
    a first projection formed on a first layer containing a first material; and
    a plurality of second projections formed around the first projection and containing a material capable of being subjected to anodic oxidation,
    wherein a height difference between the first projection and each of the plurality of second projections is not more than 200 nm.

2. A structure according to claim 1, wherein the first projection is formed of an oxide of the first material.

3. A structure according to claim 1, wherein the first material contains at least one element selected from among W, Nb, Mo, Ta, Ti, Zr and Hf.

4. A structure according to claim 1, wherein the first projection is made of an electrically conductive material.

5. A structure according to claim 1, wherein the material capable of being subjected to anodic oxidation is aluminum.

6. A structure according to claim 1, wherein the first projection is provided in plurality, and wherein a density of the plurality of second projections is twice of more a density of the plurality of first projections.

7. A structure according to claim 1, wherein the first projection is provided in plurality, and wherein the plurality of first projections and the plurality of second projections are regularly arranged.

8. A structure according to claim 1, wherein a protective layer is formed on the first projection and the plurality of second projections.

9. A method of manufacturing a structure having a plurality of projections, comprising the steps of:
    preparing a member having a second layer formed on a first layer;
    forming a plurality of pores in the second layer;
    forming a first projection in each of the plurality of pores; and
    removing the second layer such that a plurality of second projections appears around the first projection,
    wherein a height difference between the first projection and each of the plurality of second projections is not more than 200 nm.

10. A method of manufacturing a structure according to claim 9, wherein the step of forming the first projection is a step of oxidizing the first layer exposed at the bottom of each of the plurality of pores.

11. A method of manufacturing a structure according to claim 9, wherein the step of forming the first projection is a step of filling an electrically conductive material in each of the plurality of pores.

12. A method of manufacturing a structure according to claim 9, wherein the step of forming the plurality of pores in the second layer is an anodic oxidation step.

13. A method of manufacturing a structure according to claim 9, wherein the second layer contains aluminum and the first layer contains at least one element selected from among W, Nb, Mo, Ta, Ti, Zr and Hf.

14. A method of manufacturing a structure having dents, the method comprising the step of forming the dents in a film of a workpiece by using, as a stamper, a structure according to claim 1.

15. A structure according to claim 1, wherein the first projection has a different shape than each of the plurality of second projections.

16. A method of manufacturing a structure according to claim 9, wherein the first projection has a different shape than each of the plurality of second projections.

* * * * *

UNITED STATES PATENT AND TRADEMARK OFFICE
CERTIFICATE OF CORRECTION

PATENT NO. : 6,982,217 B2
DATED : January 3, 2006
INVENTOR(S) : Aya Imada et al.

It is certified that error appears in the above-identified patent and that said Letters Patent is hereby corrected as shown below:

<u>Column 3,</u>
Line 32, "is may" should read -- may --.

<u>Column 11,</u>
Line 23, "twice of" should read -- twice or --.

Signed and Sealed this

Sixth Day of June, 2006

JON W. DUDAS
*Director of the United States Patent and Trademark Office*